United States Patent [19]
Kitamura et al.

[11] 4,349,762
[45] Sep. 14, 1982

[54] FIBER REINFORCED PIEZOELECTRIC BENDER TRANSDUCER

[75] Inventors: Tomosaburo Kitamura; Kosuke Miyahara; Yoichi Kodera, all of Kanagawa, Japan

[73] Assignee: Sony Corporation, Tokyo, Japan

[21] Appl. No.: 143,339

[22] Filed: Apr. 24, 1980

[30] Foreign Application Priority Data

May 2, 1979 [JP] Japan .................................. 54-54266

[51] Int. Cl.³ ............................................ H01L 41/08
[52] U.S. Cl. .................................... 310/332; 310/331
[58] Field of Search .............................. 310/330–332, 310/346

[56] References Cited

U.S. PATENT DOCUMENTS

| | | | |
|---|---|---|---|
| 2,518,793 | 8/1950 | Keller | 310/346 |
| 3,390,287 | 6/1968 | Sonderegger | 310/346 X |
| 3,447,217 | 6/1969 | Kumada | 310/332 X |
| 3,629,625 | 12/1971 | Schafft | 310/332 |
| 4,047,060 | 9/1977 | Schafft | 310/346 X |

*Primary Examiner*—Mark O. Budd
*Attorney, Agent, or Firm*—Hill, Van Santen, Steadman, Chiara & Simpson

[57] ABSTRACT

An electro-mechanical transducer having a first layer made of piezoelectric material having opposing major surfaces, a pair of electrodes formed on the major surfaces of the first layer, respectively, and a second layer clamped at its one surface to one of the surfaces of the first layer. In this case, the first layer has a Young's modulus of E, the second layer has a Young's modulus of Ex in one direction and a Young's modulus Ey in the direction perpendicular to the one direction in the major surface, The Young's moduli E, Ex, Ey satisfy the relation $E > Ey$, $Ex > Ey$, and one end of the first and second layers along the one direction is clamped.

7 Claims, 10 Drawing Figures

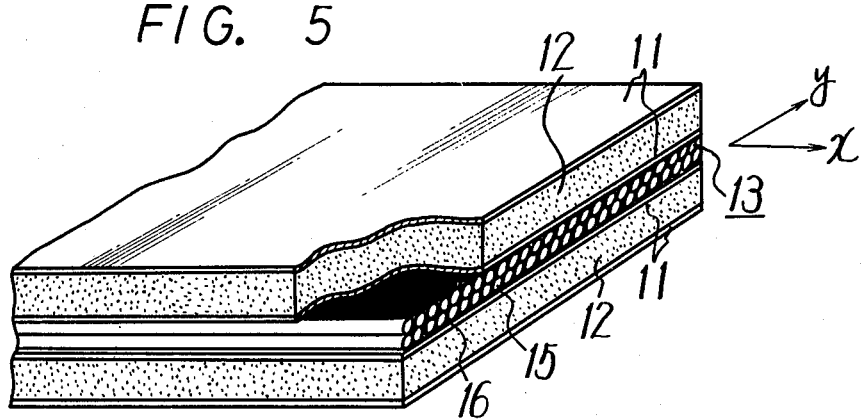
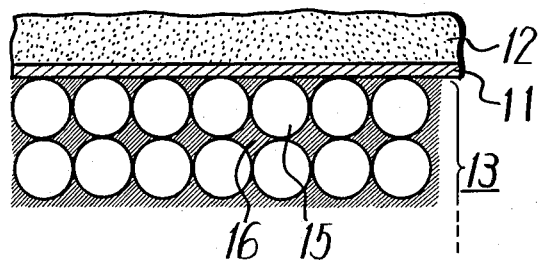
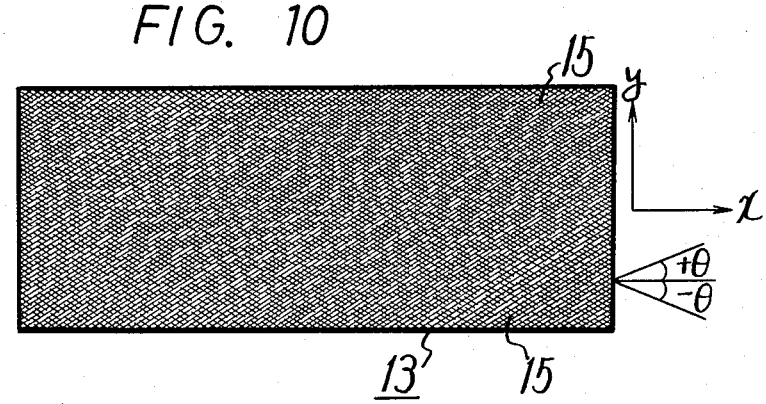

FIBER REINFORCED PIEZOELECTRIC BENDER TRANSDUCER

BACKGROUND OF THE INVENTION

1. Field of the Invention

The present invention generally relates to an electro-mechanical transducer for converting an electrical signal into a mechanical displacement such as a so-called bimorph, and is directed more particularly to an electro-mechanical transducer which is fixed at its one end and carries at its other end a magnetic head and in which a mechanical displacement is generated so as to displace the magnetic head in response to a voltage applied to the transducer.

2. Description of the Prior Art

Recently, in order to increase the record density in a magnetic recording and reproducing apparatus such as a VTR (video tape recorder), such a test to make the width of a record track as narrow as possible has been attempted. In the VTR or the like in which the track width is narrow, the position of a playback or reproducing magnetic head relative to the record track requires higher accuracy. It is rather difficult in technical point of view or requires high cost to present the above positional relation of high accuracy by merely mechanical accuracy. Therefore, in the art an electro-mechanical transducer element is employed to control the positional relation of the magnetic head to the record track to be always at a predetermined relation. That is, the electro-mechanical transducer element is fixed at its one end to a magnetic head drum and carries a magnetic head coupled to its other end, and an electrical signal, which responds to the variation of a reproduced signal caused by the variation in the positional relation between the magnetic head and record track, is applied to the electro-mechanical transducer element to displace the other end thereof and hence to set the magnetic head to be always at a correct position relative to the record track.

In general, an electro-mechanical transducer element used in the tracking servo of the VTR must be displaced greatly by a low voltage. Especially, in a VTR with a wide track width, the electro-mechanical transducer must be displaced greatly such as for about several hundreds to six hundred micro meters ($\mu$m).

As shown in FIG. 1, a prior art electro-mechanical transducer element consists of two piezoelectric plates 2, each having electrodes 1 coated on its both major surfaces and a plate such as a so-called shim plate 4 located between the piezoelectric plates 2 to be bonded thereto through adhesive agent 3. The piezoelectric plates 2 are each made of piezoelectric material such as ceramic, polymer, complexion of ceramic and polymer or the like, the shim plate 4 is made of metal such as titanium, stainless steel, phosphor bronze or the like, and the adhesive agent 3 is made of a conductive adhesive, respectively.

The piezoelectric plates are polarized to align the polarization in the direction perpendicular to the major surfaces. However, the directions of polarization are opposite with respect to each other in the piezoelectric plates.

When a voltage is applied across the outer electrodes 1 of the piezoelectric plates 2 so as to give them electric fields perpendicular to the major surface, one piezoelectric plate 2 expands while the other piezoelectric plate 2 shrinks, so that the piezoelectric transducer element is displaced. That is, as shown in FIG. 1, when one end of the electromechanical transducer element consisting of the laminated piezoelectric plates 2 and shim plate 4 is mechanically fixed or clamped, the other end of the transducer element is displaced as shown by arrows in FIG. 1.

However, the above prior art electro-mechanical transducer element is not displaced as much.

When a given voltage is applied across the electrodes 1 coated on both the major surfaces of piezoelectric plate 2 shown in FIG. 2, the piezoelectric plate 2 is expanded or shrunk in accordance with the direction of the electric field applied thereto. In this case, the expansion and shrinkage are generated with respect to x- and y- directions which are perpendicular with each other. Therefore, when the shim plate 4 made of metal whose modulus of elasticity or Young's modulus is equal with respect to both x- and y- directions or which has isotropy in Young's modulus is bonded to one major surface of the piezoelectric plate 2 to mechanically fix or clamp the same with respect to both x- and y- directions, bendings are generated in the piezoelectric plate 2 in both x- and y- directions, as shown in FIG. 3. Accordingly, if the displacement by the bending is only one direction, for example, x-direction is necessary, the bending in the y-direction rather prevents the bending in the x-direction in view of construction.

Further, in the electro-mechanical transducer element shown in FIG. 1, generally, polymer adhesive agent is used as the adhesive agent 3. In fact, however, the softness of this adhesive agent operates to prevent suitable clamp of the piezoelectric plate 2 and accordingly the generation of bending is suppressed.

Thus, it will be apparent that the prior art electromechanical transducer element can not present sufficient displacement.

OBJECTS AND SUMMARY OF THE INVENTION

It is an object of the present invention to provide an improved electro-mechanical transducer.

It is another object of the present invention to provide an electro-mechanical transducer in which one end of the transducer is clamped and represents a large displacement at another end.

It is a further object of the present invention to provide an electro-mechanical transducer suitable for use in tracking servo-mechanism of a magnetic transducer head and magnetic recording medium.

According to one aspect of the present invention, there is provided an electro-mechanical transducer which comprises:

(a) a first layer made of piezoelectric material having opposing major surfaces;
(b) a pair of electrodes formed on said major surfaces respectively; and
(c) a second layer whose one surface is clamped to one of said surfaces of said first layer; said first layer having a Young's modulus of E, said second layer having a Young's modulus Ex in one direction, and a Young's modulus Ey in a direction perpendicular to said one direction in said major surface, said Young's modulus E, Ex, Ey satisfying the relation $E > Ey$, $Ex > Ey$, and one end of said layers along said one direction being clamped.

The other objects, features and advantages of the present invention will become apparent from the following description taken in conjunction with the accompanying drawings through which the like references designate the same elements.

BRIEF DESCRIPTION OF THE DRAWINGS

FIG. 5 is an enlarged perspective view showing the essential part of the example of the invention shown in FIG. 4 partially cut away;

FIG. 7 is a cross-sectional view showing, in an enlarged scale, the essential part of the example of the invention shown in FIG. 5;

FIG. 10 is an enlarged plan view of another example of a second material used in the invention.

DESCRIPTION OF THE PREFERRED EMBODIMENTS

The electro-mechanical transducer (element) according to the present invention will be hereinafter described with reference to the attached drawings.

Figure 1:
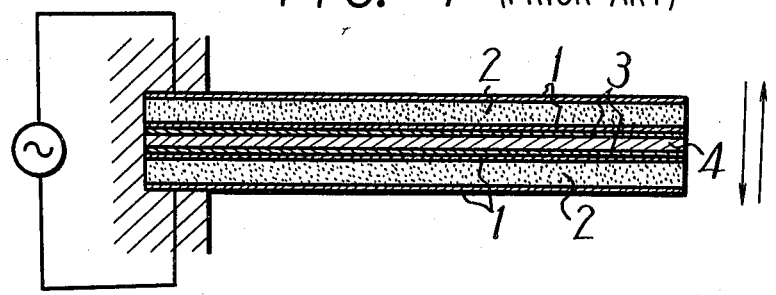
FIG. 1 is a cross-sectional view showing an example of the prior art electro-mechanical transducer.
Figure 2:
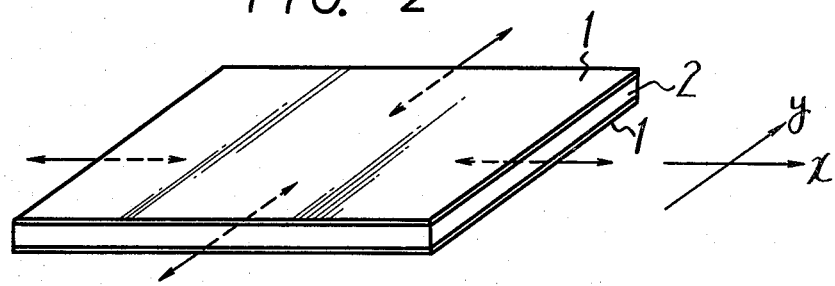
FIGS. 2 and 3 are respectively perspective views used to explain the prior art example shown in FIG. 1.
Figure 3:
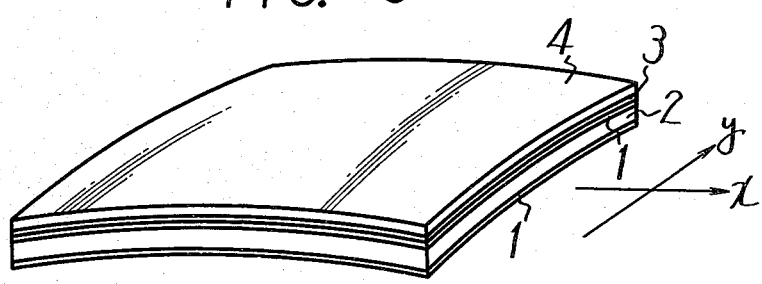
Figure 4:
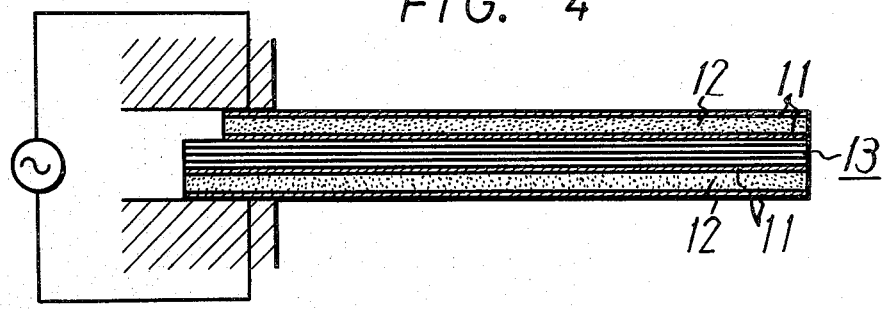
FIG. 4 is a cross-sectional view showing, in an enlarged scale, an example of the electro-mechanical transducer according to the present invention.

An example of the electro-mechanical transducer according to the present invention will be described with reference to FIGS. 4 and 5. In this example, two piezoelectric plates each having electrodes 11 coated both major surfaces thereof, i.e., first materials or layers 12 are provided, and a second material or layer 13 is interposed between the first layers 12 for the first and second layers to be integrally laminated.

The first layers 12, i.e., piezoelectric plates are each made of piezoelectric ceramic plate such as lead zirconate titanate ceramic plate, while the second layer 13 serving as a shim plate, which is interposed between the piezoelectric plates 12 to cramp them or effect reinforcing material, is made of a material having anisotropy in Young's modulus. As the second layer 13, a carbon fiber sheet may be used which is made of, for example, carbon fibers each extended in one direction and adhesives made of epoxy resin into which the carbon fibers are impregnated or immersed. This carbon fiber sheet presents the maximum Young's modulus in the extending direction of the carbon fibers thereof but the minimum Young's modulus in the direction perpendicular to the extending direction of the carbon fibers.

When the carbon fiber sheet is used to form the electro-mechanical transducer element, the carbon fiber sheet is so arranged that the direction along which the carbon fiber sheet presents the maximum Young's modulus or the extending direction of the carbon fibers becomes parallel to the direction along which the electro-mechanical transducer must be expanded or shrunk which pertains to generation of displacement, namely the x-direction in the illustrated example.

An example of the electro-mechanical transducer according to the invention will be described in detail.

EXAMPLE I

Figure 6:
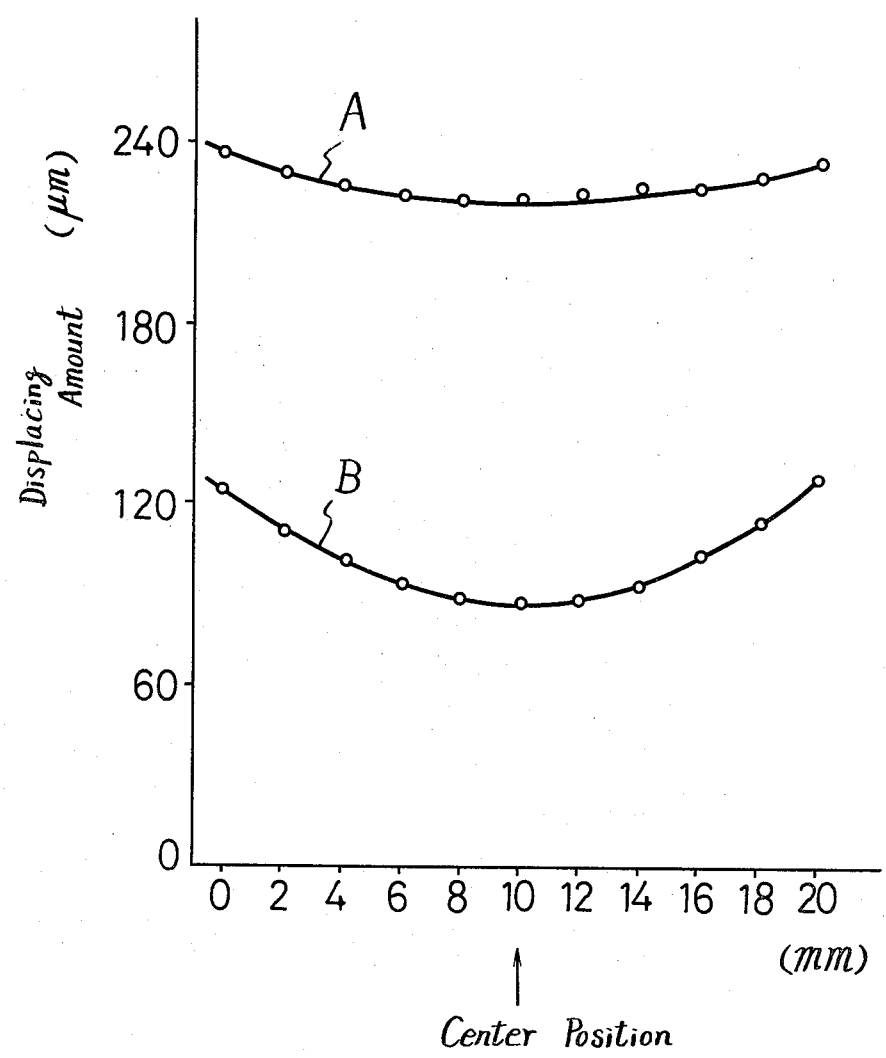
FIG. 6 is a graph showing the measured displaced amount of the example shown in FIG. 4.

As the first layer 12 or piezoelectric plate, a piezoelectric plate consisting of piezoelectric ceramics made of lead zirconate titanate ceramics (PZT) with the thickness of 250 μm is prepared, and then, for example, Au is coated on both major surfaces of the piezoelectric plate 12 by vacuum evaporation to form electrodes 11 on the major surfaces thereof. The piezoelectric plate 12 is subjected to a poling process in the direction perpendicular to the major surface thereof. In this example I, two piezoelectric plates 12 are so subjected to the poling process that the directions of their polarizations are opposite to each other. A number of carbon fibers 15, each having the diameter of 10 μm, are arranged to be extended about in one direction and then immersed or impregnated into adhesive agent 16 made of epoxy resin to form a carbon fiber sheet with a thickness of 100 μm. This carbon fiber sheet is used as a shim plate or second layer 13. That is, the carbon fiber sheet or shim plate 13 is sandwiched between the two piezoelectric plates 12. Under the above state, they are heated and pressed at 120° C. to 130° C. for three hours to harden the adhesive agent 16, from which an electromechanical transducer element of 25 mm×25 mm is made. In this case, the extending direction of each of the carbon fibers of the shim plate 13 in the electro-mechanical transducer element is taken as the x-direction, the direction perpendicular to the x-direction and along the major surface of the electro-mechanical transducer element as the y-direction, and the electro-mechanical transducer element is fixed at its one end portion over the width of 5 mm therefrom in the x-direction. Then, the displacing amounts of the electro-mechanical trandsucer element over the range from the center thereof in the y-direction to the both sides by 10 mm i.e., over a range of 20 mm and in the direction perpendicular to the surface of the electro-mechanical transducer element are measured. The measured result is shown in the graph of FIG. 6 by a curve A. Also, the electro-mechanical transducer element is fixed at its one end portion over the width of 5 mm therefrom in the y-direction. Then, the displacing amounts of the electro-mechanical transducer element over the range from the center thereof in the x-direction to both sides by 10 mm, i.e., range of 20 mm and in the direction perpendicular to the surface of the electromechanical transducer element are measured. The measured results are shown in the graph of FIG. 6 by a curve B. In the above measurements, a voltage of 200 volts peak to peak is applied across the outer most electrodes of the electro-mechanical transducer element under the state shown in FIG. 4. As will be apparent from the comparison of the curves A and B, the displaced amount of the electro-mechanical transducer element with its one end along the x-direction being fixed, which is the same extending direction of the carbon fibers, (referred to hereinafter as the displaced amount in the x-direction) is greater than those with its one end along the y-direction being fixed (referred to hereinafter as the displaced amount in the y-direction) by about 2.5 times at the central position and about 1.8 times at both end positions. That is, the former represents high sensitivity. The reason of the fact that the displaced amount in the y-direction is lower than that in the x-direction may be considered that since the y-direction of the shim plate 13 is the arranging direction of the carbon fibers 15, the Young's modulus of shim plate 13 in this direction is low with the result that when the expansion and shrinkage are generated in the piezoelectric plates 12 by the piezoelectric effect or electrostrictive effect, the shim plate 13 is somewhat expanded and shrunk in response to the expansion and shrinkage of piezoelectric plates 12 to reduce the clamp effect of the former to the latter, and hence bending is difficult to be generated in the piezoelectric plates 12 in this direction, and accordingly, no great displacement is generated therein. On the contrary, as to the x-direction, this direction is along the longitudinal direction of the carbon fibers in the shim plate 13 and the Young's modulus thereof in this direction is large. Therefore, the clamp effect of shim plate 13 for the piezoelectric plates 12 is large and hence a large displacing amount is obtained. In addition, since the bending of the piezoelectric plates 12 in the y-direction is suppressed as set forth, the bending in the x-direction is generated easily in the piezoelectric plate 12 with the result that the displacing amount thereof becomes large in the x-direction.

Comparing the curves A and B, the displacing amount at the center of curve A is smaller than that of curve B. This reason could be considered that the generation of bendings in the x- and y-directions is apt to be suppressed by the other beings in the y- and x-directions, especially at the center portion thereof, but since the above electro-mechanical transducer element has less bending in the y-direction, the bending in the x-direction is generated large even in the center portion which avoids the lowering of displacing amount at the center portion.

The electro-mechanical transducer element, which is provided by interposing between piezoelectric plates 12 the shim plate 13, which is made by immersing a number of fibers such as carbon fibers 15 into adhesive agent 16, and hardening and pressing them integral as the above example, has such construction that the fibers 15 are bonded by the adhesive agent 16 as shown in FIG. 7. In this case, since the fibers 15 are bonded to be almost in direct contact with the electrode 11 of piezoelectric element 12, therebetween presented is almost no or very thin layer of adhesive agent 16 which is rich in elasticity and apt to be displaced. Therefore, it can be avoided that the clamp effect of the shim plate 13 for the piezoelectric plate 12 is reduced by the adhesive agent 16.

Terminals can be led out from the inner electrode 11 of each of the first materials or layers, i.e., piezoelectric plates 12 by such a manner that a conductive layer such as metal foil or evaporated metal layer is coated on an end portion of the second material or shim plate 13 at the fixed side of electro-mechanical transducer element to be in contact with electrode 11 thereof and then a terminal is led out from the conductive layer, or though not shown a recess or cut-out is formed on a part of the shim plate 13 to partially expose the inner electrodes 11 of the piezoelectric plates 12 from which terminals are led out.

In order to clarify the feature of the present invention, a comparison example will be now described.

COMPARISON EXAMPLE 1

Figure 8:
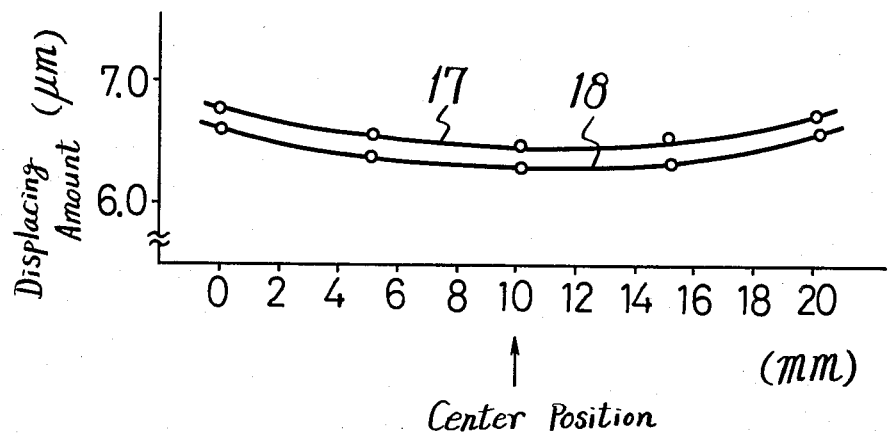
FIG. 8 is a graph showing the measured displaced amount of a comparison example with the invention.

An electro-mechanical transducer is formed of so-called polymeric piezoelectric plates each made of a complex material of poly fluorinated vinylidene and powder of piezoelectric ceramics which is used as the piezoelectric plate 12 in the electro-mechanical transducer element explained in the example I. In this case, a shim plate substantially the same as that 13 used in the example 1 is used. The displacing amounts of comparison example 1 in the x- and y-directions are respectively measured by the same manner as that of example 1. The measured results are respectively shown by curves 17 and 18 in the graph of FIG. 8. As will be apparent from the curves 17 and 18, there is almost no difference between the displacing amounts in the x- and y-directions. In other words, according to the comparison example 1, even though such a shim plate is used which has anisotropy in Young's modulus or whose Young's modulus in the x-direction is higher than that in the y-direction similar to the example 1, there is generated no difference between the displacing amounts in the x- and y-directions. This explanation can be considered that, in this comparison example 1, the piezoelectric plates of the electromechanical transducer element are each made of the polymeric piezoelectric plate whose Young's modulus is smaller than the smaller Young's modulus of the shim plate in the y-direction and hence the clamp effect is too large. At this point, exists the reason of the present invention why the Young's modulus E of piezoelectric plate 12 (first material or layer) is selected higher than the Young's modulus Ey of the shim plate 13 (second material or layer) in the y-direction.

Incidentally, the Young's modulus of the piezoelectric ceramics used in the example 1 is $5 \sim 10 \times 10^5$ kg/cm$^2$, for example, $7 \times 10^5$ kg/cm$^2$, the Young's modulus of the carbon fiber sheet in the fiber direction is $13.5 \times 10^5$ Kg/cm$^2$, its Young's modulus in the direction perpendicular to the fiber direction is $1.0 \times 10^5$ Kg/cm$^2$, and the Young's modulus of the polymeric piezoelectric plate used in the comparison example 1 is $2.6 \times 10^4$ Kg/cm$^2$. Further, the Young's modulus of Ti used in a prior art seam plate is $10 \times 10^5$ Kg/cm$^2$.

Figure 9:
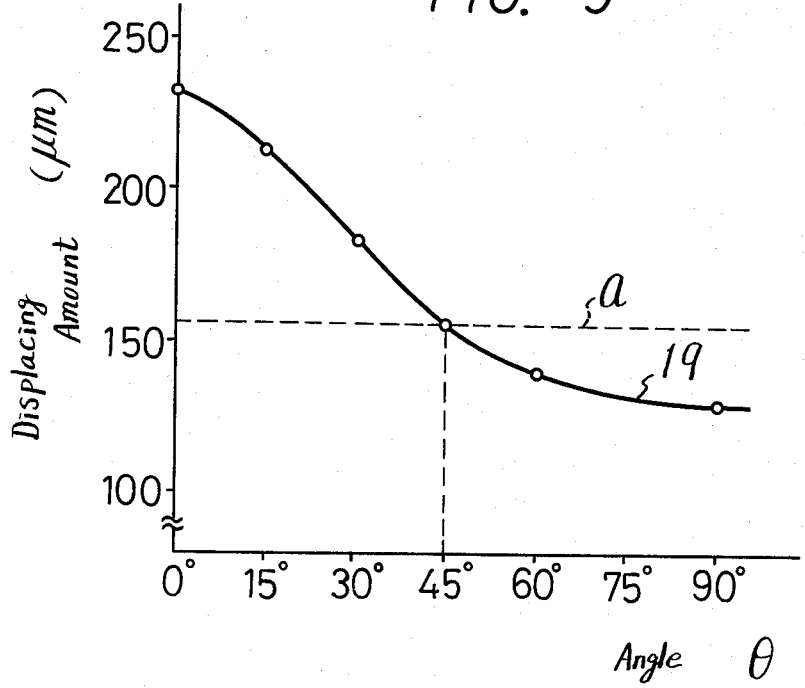
FIG. 9 is a graph showing the measured result of the relation between displaced amount of a second material and the direction of its fibers of a second material.

In the example 1, the shim plate 13 is so arranged so that it has the maximum Young's modulus in the x-direction and the minimum Young's modulus in the y-direction. It is, however, possible that a certain angle is provided between the extending direction of the fibers in the shim plate 13 and the x-direction without coinciding both directions. When in the example 1 an angle $\theta$ between the extending direction of the carbon fibers in the shim plate 13 and the x-direction is changed 5° by 5° from 0° and the displacing amount of the electro-mechanical transducer element in the x-direction is measured, the result shown by a curve 19 in the graph of FIG. 9 is obtained. In the graph of FIG. 9, the displacing amount indicated by a broken line a is the value of the case where a metal plate is used as a shim plate of an electro-mechanical transducer element as in the prior art. This value of the displacing amount approximately corresponds to the case where the angle $\theta$ is selected as 45°. In other words, when the angle $\theta$ is selected smaller than 45°, anisotropy appears in the Young's modulus of the shim plate and the sensitivity is improved thereby.

By the way, the following table 1 shows the measured Young's modulus Ex of the shim plate 13 made of a carbon fiber sheet and used in the example 1 in the x-direction and the ratio between the Young's moduli Ex and Ey by changing the angle $\theta$.

TABLE 1

| Angle $\theta$ | Ex (Kg/cm$^2$) | Ex/Ey |
|---|---|---|
| 0° | $13.5 \times 10^5$ | 13.5 |
| 15° | $10.35 \times 10^5$ | 9 |
| 30° | $6.12 \times 10^5$ | 4.5 |
| 45° | $2.7 \times 10^5$ | 1 |

TABLE 1-continued

| Angle θ | Ex (Kg/cm²) | Ex/Ey |
|---|---|---|
| 60° | $1.35 \times 10^5$ | 0.22 |
| 75° | $1.15 \times 10^5$ | 0.11 |
| 90° | $1.0 \times 10^5$ | 0.07 |

Further, when a sheet made of arranged fibers such as when carbon fibers are used as the second layer 13 which has anisotropy in Young's modulus as described above, there is no need for the extending direction of the fibers to be limited in one direction with the angle $\theta$ of 0° to 45°. It is of course possible that, for example, as shown in FIG. 10 by thin lines, a sheet made of fibers 15 such as carbon fibers arranged with the angle $+\theta$ to the x-direction and a sheet made of fibers 15 such as carbon fibers arranged with the angle $-\theta$ to the x-direction are integrally laminated or made integral to be the second layer 13.

In some cases, it is possible that a sheet made of similar fibers arranged with the angle $\theta$ of 90° (not shown) is interposed between the two sheets to be integrated therewith as a unitary member.

As described above, according to the present invention, since the electro-mechanical transducer element, which can generate a large displacement, is made, the electro-mechanical transducer element of the invention is suitable to be used as the tracking servo for the magnetic head in, for example, a VTR and can be driven by a relatively low voltage for the same amount of displacement.

Further, when a sheet made of fibers such as carbon fibers immersed into adhesive agent is used as the second layer, i.e., shim plate, there is no need to especially coat adhesive agent on the shim plate as in the prior art. Therefore, manufacturing process becomes simple, and accordingly, the electro-mechanical transducer can be manufactured inexpensively.

Also, the displacement of the electro-mechanical transducer element in the y-direction, which has no direct relation to generate the displacement, is suppressed in the invention, so that it can be avoided that a crack or the like is generated in the electro-mechanical transducer element upon its maximum amplitude operation.

In the above description, the invention is applied to the electro-mechanical transducer element which consists mainly of laminated two piezoelectric plates, but it will be apparent that the invention can be applied to various types of electro-mechanical transducer elements with the same effects.

It will be apparent that many modifications and variations could be effected by one skilled in the art without departing from the spirit or scope of the novel concepts of the present invention, so that the spirit or scope of the invention should be determined by the appended claims.

We claim as our invention:

1. An electro-mechanical transducer comprising:
   (a) a first layer made of piezoelectric material having opposing major surfaces;
   (b) a pair of electrodes formed on said major surfaces, respectively; and
   (c) a second layer comprising a plurality of fibers whose surface is clamped to one of said surfaces of said first layer; said first layer having a Young's modulus of E, said second layer having a Young's modulus Ex in one direction x, and a Young's modulus Ey in a direction y perpendicular to said one direction in said major surface, said Young's moduli E, Ex, Ey satisfying the relation E>Ey, Ex>Ey, and one end of said layers being clamped along one edge so that its opposite edge is free to move and said x and y directions lying in the plane of said second layer.

2. An electro-mechanical transducer according to claim 1 further comprising a third layer made of piezoelectric material having a pair of electrodes provided on opposing major surfaces thereof and clamped to another surface of said second layer, so as to sandwich said second layer by said first and Third layers and said third layer also clamped along one edge.

3. An electro-mechanical transducer according to claim 2, wherein said first and third layers are made of piezoelectric ceramics.

4. An electro-mechanical transducer comprising:
   (a) a first layer made of piezoelectric material having opposing major surfaces;
   (b) a pair of electrodes formed on said major surfaces, respectively;
   (c) a second layer whose surface is clamped to one of said surfaces of said first layer; said first layer having a Young's modulus of E, said second layer having a Young's modulus Ex in one direction, and a Young's modulus Ey in a direction perpendicular to said one direction in said major surface, said Young's moduli E, Ex, Ey satisfying the relation E>Ey, Ex>Ey, and one end of said layers along said one direction being clamped, and wherein said second layer is composed of carbon fibers oriented in said one direction impregnated with adhesives so as to represent an anisotropy in Young's modulus.

5. An electro-mechanical transducer comprising two piezoelectric plates each having electrodes coated on both major surfaces thereof, said piezoelectric plates being formed as a piezoelectric ceramic plate, a shim plate interposed between said two piezoelectric plates and clamped therebetween forming a shim plate, said shim plate being made of a material having anisotropy in Young's modulus, and in which said shim plate is a carbon fiber sheet in which the carbon fibers extend in one direction and in which said carbon fibers each extend in a single direction and are embedded in an epoxy resin, said carbon fiber sheet presenting the maximum Young's modulus in the extending direction in which said fibers lie and a minimum Young's modulus in the direction perpendicular to said extending direction.

6. An electro-mechanical transducer according to claim 5 in which said two piezoelectric plates are formed of lead zirconate titanate ceramic.

7. An electro-mechanical transducer according to claim 5 wherein said carbon fibers vary in a range from $-\theta$ to $+\theta$ with $\theta$ being an angle of zero to forty-five degrees.

* * * * *